(12) United States Patent
Okojie

(10) Patent No.: US 9,452,926 B1
(45) Date of Patent: Sep. 27, 2016

(54) DOPANT SELECTIVE REACTIVE ION ETCHING OF SILICON CARBIDE

(75) Inventor: Robert Okojie, Strongsville, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 582 days.

(21) Appl. No.: 13/561,359

(22) Filed: Jul. 30, 2012

(51) Int. Cl.
*B81C 1/00* (2006.01)

(52) U.S. Cl.
CPC ....... *B81C 1/00531* (2013.01); *B81C 1/00555* (2013.01); *B81C 1/0015* (2013.01)

(58) Field of Classification Search
CPC .......... B81C 1/00531; B81C 1/00555; B81C 1/0015
USPC .................................................. 438/706, 710
See application file for complete search history.

(56) References Cited

U.S. PATENT DOCUMENTS

| | | | |
|---|---|---|---|
| 4,981,551 A | 1/1991 | Palmour | |
| 4,996,627 A | 2/1991 | Zias et al. | |
| 5,183,775 A * | 2/1993 | Levy | 438/386 |
| 5,207,103 A | 5/1993 | Wise et al. | |
| 5,578,166 A | 11/1996 | Hirota | |
| 6,723,663 B1 | 4/2004 | Wieczorek et al. | |
| 6,800,210 B2 * | 10/2004 | Patel et al. | 216/2 |
| 6,812,159 B2 | 11/2004 | Wieczorek et al. | |
| 6,847,090 B2 * | 1/2005 | Loeppert | 257/418 |
| 6,959,608 B2 | 11/2005 | Bly et al. | |
| 7,780,343 B2 * | 8/2010 | Chen et al. | 374/45 |
| 7,997,142 B2 | 8/2011 | Chiou et al. | |
| 2011/0291284 A1 | 12/2011 | Goldfarb et al. | |
| 2012/0017971 A1 | 1/2012 | Moslehi | |

* cited by examiner

*Primary Examiner* — David Vu
(74) *Attorney, Agent, or Firm* — Robert H. Earp, III

(57) ABSTRACT

A method for selectively etching a substrate is provided. In one embodiment, an epilayer is grown on top of the substrate. A resistive element may be defined and etched into the epilayer. On the other side of the substrate, the substrate is selectively etched up to the resistive element, leaving a suspended resistive element.

7 Claims, 10 Drawing Sheets

DOPANT SELECTIVE REACTIVE ION ETCHING OF SILICON CARBIDE

FIELD

The present invention relates to a method of fabricating structures and, more particularly, to a method of fabricating patterned or non-patterned conductive or non-conductive microstructures.

BACKGROUND

Reactive ion etching (RIE) can be used for etching silicon carbide (SiC) to obtain a desired microstructure. For example, batch fabricated pressure sensors in SiC wafers using conventional RIE or its variations (e.g., inductively coupled plasma deep reactive ion etching (ICP-DRIE)) have become the standard for fabricating structures in SiC. For instance, to produce SiC pressure sensors for low pressure applications of less than 20 psi, the diaphragm of the sensors must be thinned down to thicknesses of less than 10 microns. The utilization of RIE or ICP-DRIE to accomplish this has been unsuccessful, largely due to the introduction of etch-induced defects that compromise the structural integrity of the thin diaphragm, i.e., the reliability of the sensor. This may also cause a significant drop in the full scale output of the sensor, thereby constricting the application or use of the sensor.

A significant adverse effect of an etch-trench artifact is that it prevents the diaphragm from being thinned down in order to increase the sensitivity and resolution of the sensor and prevents the sensor from being used in very low pressure environments. Current technology limits the diaphragm thickness to 25 microns and limits the sensor applicability to approximately 50 psi. Below this pressure, the sensor becomes less sensitive and signal-to-noise ratio degrades significantly.

The inability to produce thinner diaphragms to allow for lower pressure sensing effectively precludes the use of SiC pressure sensors for sub-psi dynamic pressure sensing that is beneficial for combustor dynamics studies. Furthermore, because RIE is a blind, directional, and sometimes non-uniform process, it results in the creation of etch-induced defects that are known to cause reliability problems, such as premature failures. Thus, it may be beneficial to provide a method of fabricating thinner microstructures in SiC.

SUMMARY

Certain embodiments of the present invention may provide solutions to the problems and needs in the art that have not yet been fully identified, appreciated, or solved by current fabrication techniques. For example, one or more embodiments of the present invention pertain to a method of fabricating patterned or non-patterned conductive or non-conductive SiC microstructures with diaphragms having a thickness of five microns or less. The method may utilize plasma and reactive ion etching to facilitate the fabrication of ultra-thin microstructures in SiC that the current state of the art cannot produce.

In one embodiment, a method for selective etching is provided. The method includes determining a flow rate for etching a semi-insulated substrate. The method also includes dopant selective reactive ion etching the semi-insulated substrate based on the determined flow rate.

In another embodiment, a method for selective etching is provided. The method includes defining a pattern for a resistive element on an epilayer of a substrate. The method also includes etching the epilayer of the substrate to form the resistive element on the epilayer of the substrate. The method further includes dopant selective reactive ion etching a semi-insulated portion of the substrate to isolate the resistive elements formed in the epilayer of the substrate.

In yet another embodiment, a method for selective etching is provided. The method includes growing an epilayer on a substrate. The method also includes etching through the epilayer of the substrate to form a resistive element. The method further includes dopant selective reactive ion etching through the substrate to form a suspended resistive element on the epilayer of the substrate.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

One or more embodiments pertain to performing selective etching on a semi-insulated substrate having an epilayer of less than 5 microns. The semi-insulated substrate may be an insulator with no, or very minimum, mobile conductive charges, and the epilayer may include the conductive charges.

It should be appreciated that because a semi-insulated substrate includes few conductive charges, a section of the semi-insulated substrate may be doped, or grown on, such that the electrical properties of the doped section of the substrate are changed. For the purposes of this disclosure, the doped layer may be referred to as the epilayer. It should also be noted that the semi-insulated substrate may include high resistance. For example, the semi-insulated substrate may include a resistance of greater than $10^5$ ohms centimeters.

Generally, there may be two processes to dope, or change the conductivity of, a semi-insulated substrate. The first process may include ion implantation. Under ion implantation, the surface of the semi-insulated substrate may be implanted with nitrogen ions, for example, to produce a conductive layer of up to 2 microns in depth. Depending on the implant energy and ion flux density, the depth and concentration of the nitrogen ions in the semi-insulated substrate may vary, respectively.

The second process to dope, or change the conductivity of, the semi-insulated substrate may be to grow an epilayer on the semi-insulated substrate. For example, in this process, a 2 micron new layer of SiC may be grown on a semi-insulated substrate to a desired thickness. The concentration of dopant desired may be controlled such that the electrical conductivity of the epilayer may be different than that of the semi-insulated substrate.

Figure 1:
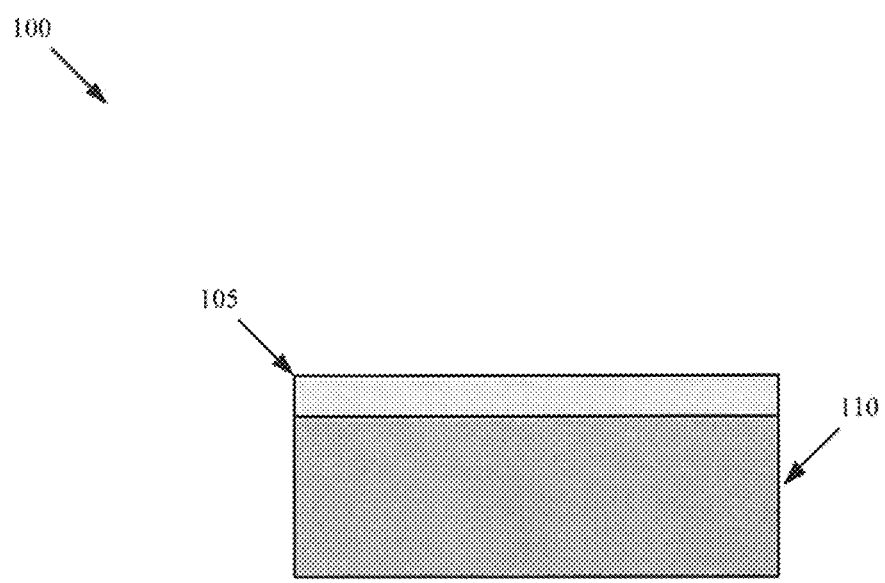
FIG. 1 illustrates a substrate, according to an embodiment of the present invention.

FIG. 1 illustrates a substrate 100, according to an embodiment of the present invention. Substrate 100 may include a heavily doped layer (e.g., epilayer) 105 and a lower doped layer (e.g., semi-insulated substrate) 110, either through the implant process or the growth process. In this embodiment, epilayer 105 may have a thickness of less than 5 microns and semi-insulated substrate 110 may have a thickness of 200 to 300 microns. Epilayer 105 may be highly conductive, while semi-insulated substrate 110 may be highly resistive with little or no conductivity. This may allow electrical activity to occur on epilayer 105 of substrate 100.

In some embodiments, epilayer 105 may include, but is not limited to, an n-type (nitrogen) epilayer or a p-type (aluminum) layer. Semi-insulated substrate 110 may include SiC, or any other type of substrate that would be appreciated by a person of ordinary skill in the art.

Figure 2:
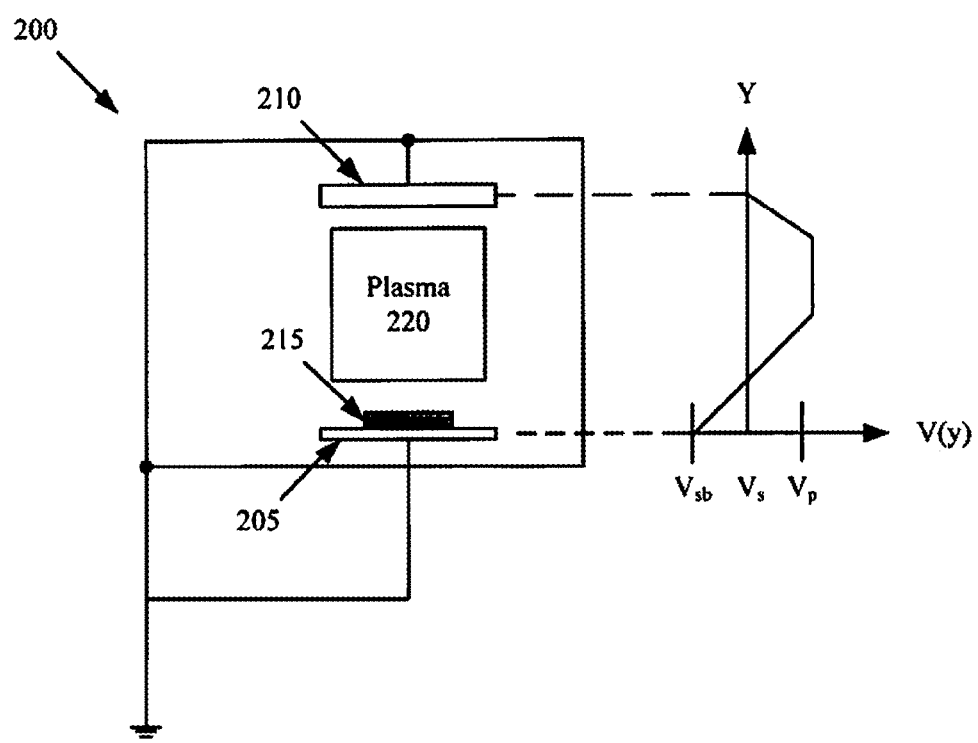
FIG. 2 illustrates an etching chamber, according to an embodiment of the present invention.

In order to etch epilayer 105 and semi-insulated substrate 110 shown in FIG. 1, an etching chamber can be used. FIG. 2, for example, illustrates an etching chamber 200, according to an embodiment of the present invention. In this embodiment, etching chamber 200 is a reactive ion-etching chamber with generic voltage spatial profile, i.e., a self-bias voltage $V_{sb}$, a plasma voltage $V_p$, and a grounded terminal $V_g$. However, it should be appreciated that etching chamber 200 may be any type of chamber that would facilitate selective etching.

Etching chamber 200 includes a positive plate 205 and a negative plate 210. Positive plate 205 may hold semi-insulated substrate 215. When, for example, $SF_6$ gas is released into chamber 200, plasma 220 is created due to the presence of an electric field created by positive plate 205 and negative plate 210 and the high voltage within chamber 200. Plasma 220 may separate the sulfur ions and fluorine ions from the $SF_6$ gas, thus causing the sulfur ions and the fluorine ions to become active species. Because the fluorine ions are negative, the fluorine ions may accelerate towards positive plate 205 of chamber 200 at a very high rate of speed.

As the fluorine ions move towards positive plate 205, the fluorine ions may encounter semi-insulated substrate 215, thereby chemically etching semi-insulated substrate 215. For example, if the epilayer side of semi-insulated substrate 215 is facing towards negative plate 210, then the epilayer may be etched. If the other side of semi-insulated substrate 215 is facing towards negative plate 210, then the other side of semi-insulated substrate 215 may be selectively etched.

For example, the other side of semi-insulated substrate 215 may be etched at one etch rate until the fluorine ions reach the epilayer, at which point, through selective etching, the epilayer etches at a slower rate.

Figure 3:
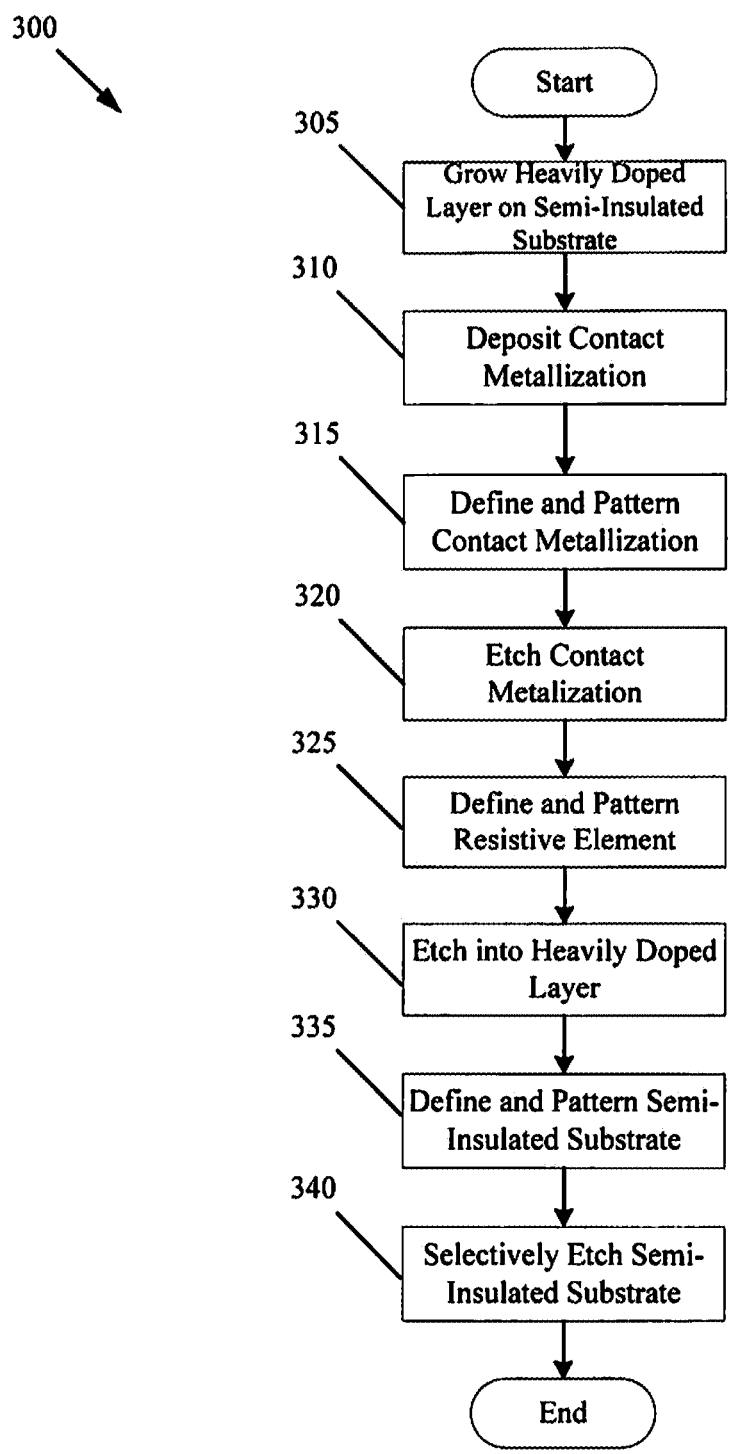
FIG. 3 illustrates a process for creating a micro heater using selective etching, according to an embodiment of the present invention.

FIG. 3 illustrates a process 300 for creating a micro heater using selective etching, according to an embodiment of the present invention. At 305, a heavily doped layer may be grown on the semi-insulated substrate. At 310, contact metallization may be deposited on the heavily doped layer. At 315, the contact metallized is defined and patterned using, for example, a photolithography process or any process that would be appreciated by a person of ordinary skill in the art. At 320, the pattern is etched on the contact metallization based on the defined pattern.

At 325, a pattern is defined for an element, e.g., a resistive heater element, to be etched on the heavily doped layer using, for example, the photolithography process. At 330, the defined pattern of the element is etched on the heavily doped layer up to the semi-insulated substrate.

At 335, a pattern to be etched is defined for the semi-insulated substrate using, for example, the photolithography process. At 340, the defined pattern is etched through the semi-insulated substrate using selective etching, i.e., etch through the semi-insulated substrate and selectively release etching near the resistive elements on the heavily doped layer. Selective etching may be considered as the process to determine when upon reaching the epilayer, the etch rate slows down, such that the resistive element defined on the heavily doped epilayer is not completely etched. The etch selectivity may be based on the etch rate of the semi-insulated substrate divided by the etch rate of the higher dope substrate. This may allow etching to occur at a continuous rate on the lower dope substrate, but at a reduced rate of etching near or on the resistive element of the heavily doped epilayer, thereby releasing the resistive elements.

Figure 4A:
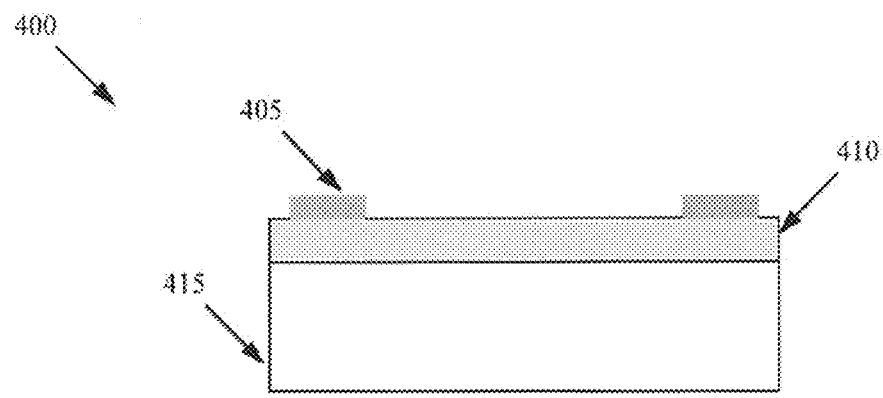
FIGS. 4A-D illustrate various views of a micro heater, according to an embodiment of the present invention.
Figure 4B:
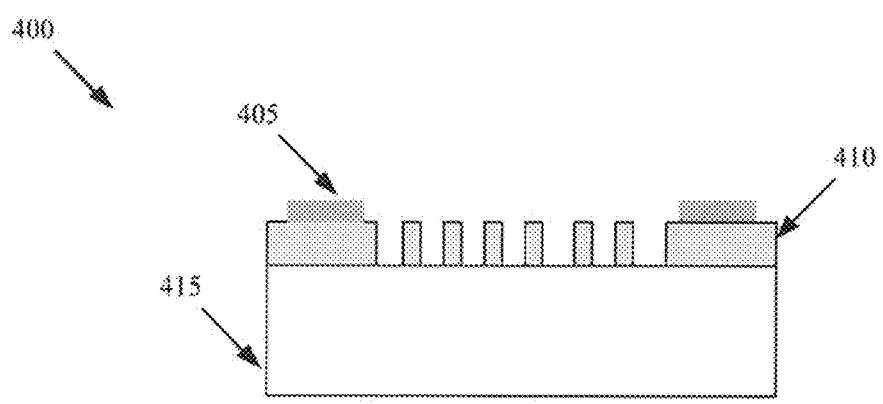
Figure 4C:
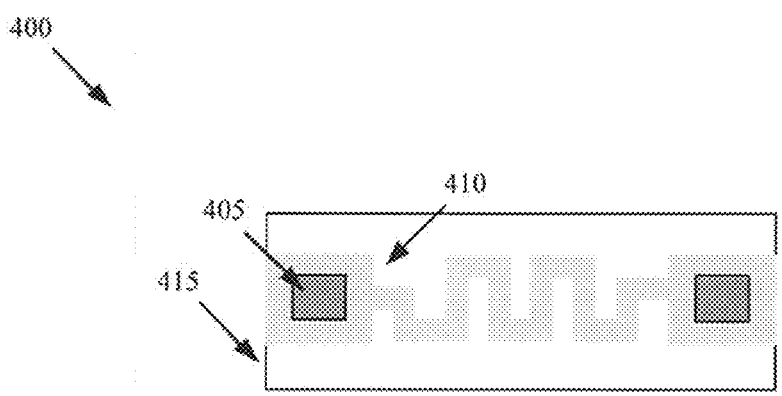
Figure 4D:
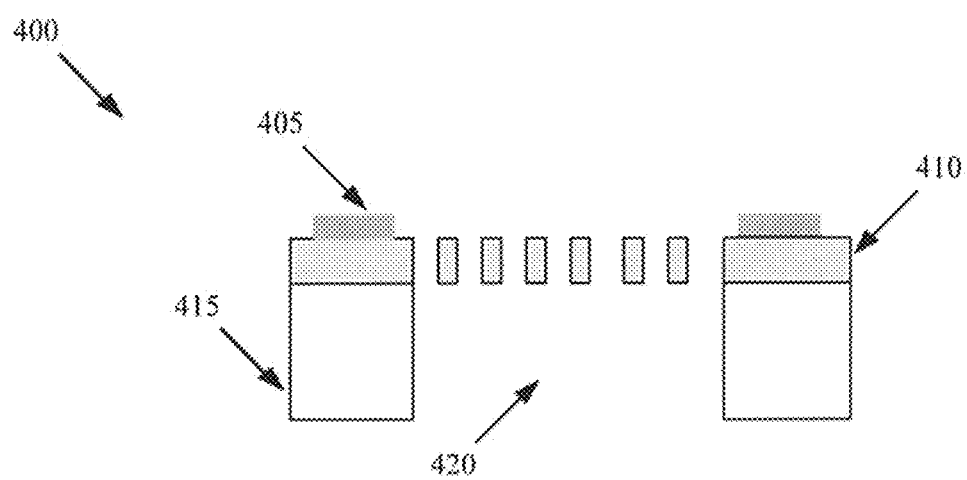

FIGS. 4A-D illustrate various views of a micro heater 400, according to an embodiment of the present invention. In this embodiment, micro heater 400 may include contact pads (or contact metallization) 405 that were defined, patterned, and etched into epilayer 410 to form micro-heater 400. An epilayer (or highly doped epilayer) 410 is also shown in FIGS. 4A-D. Epilayer 410 may be grown on a semi-insulated substrate (or lower doped layer) 415 of micro heater 400. In particular, FIGS. 4B and 4C show an epilayer 410 that was etched with a defined pattern. FIG. 4D shows a semi-insulated substrate 415, with a cavity 420, that was etched, such that epilayer 410 is not further etched, and the resistor element is released.

Figure 5:
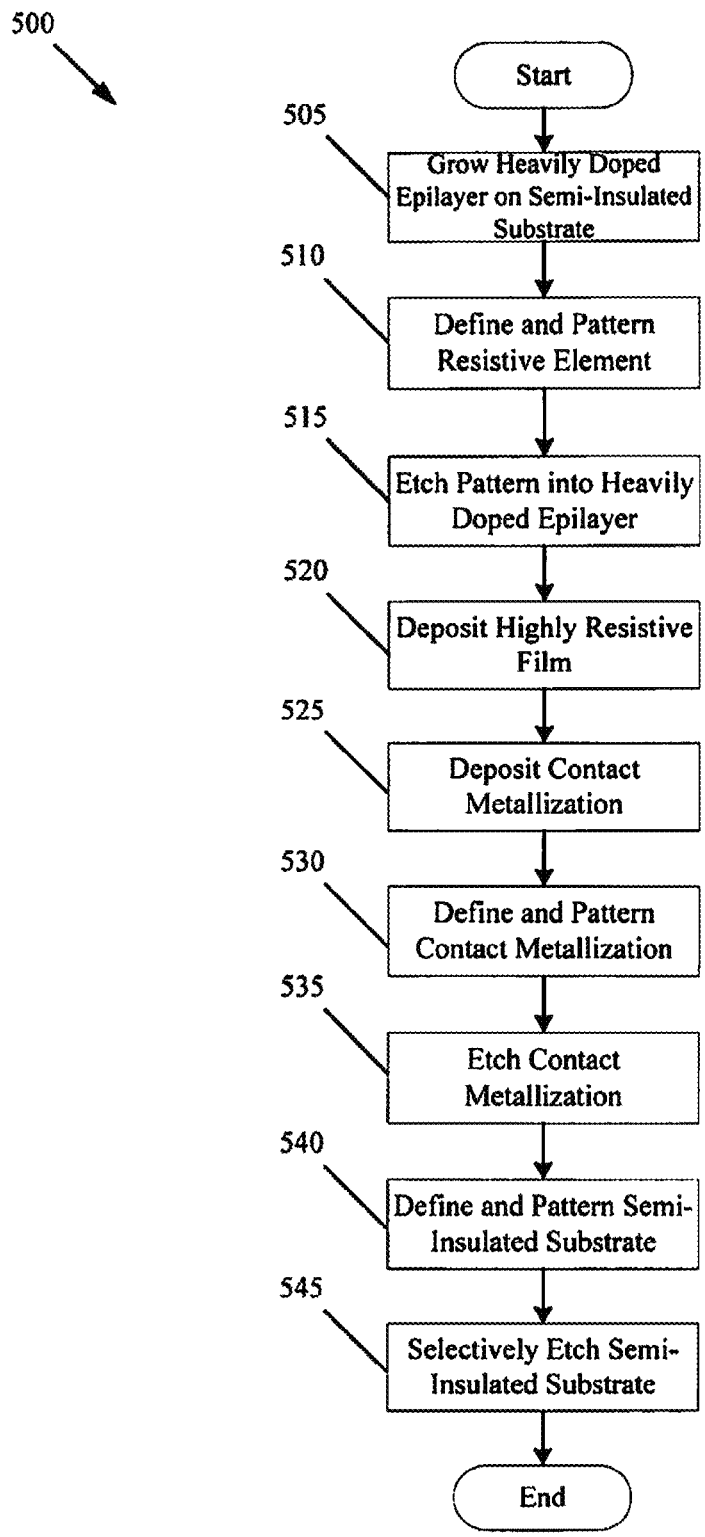
FIG. 5 illustrates a process for creating an ultra-thin pressure sensor, according to an embodiment of the present invention.

FIG. 5 illustrates a process 500 for creating ultra-thin pressure sensor, according to an embodiment of the present invention. Process 500 begins with growing a heavily doped epilayer on a semi-insulated substrate at 505. At 510, a pattern for a resistive element to be etched in the heavily doped epilayer is defined. At 515, the pattern for the resistive element is etched on the heavily doped epilayer using the defined pattern.

At 520, a highly resistive 5 micron SiC film, with resistance much greater than that of the resistive element, is deposited on the resistive element, and at 525, contact metallization may be deposited on the resistive element. Stated differently, a highly resistive thin film is deposited on the resistive element to define the thickness of the diaphragm. At 530, a pattern to be etched on the contact metallization is defined. At 535, the pattern is etched on the contact metallization using the defined pattern.

At 540, a pattern to be etched on the semi-insulated substrate is defined. At 545, the semi-insulated substrate is selectively etched based on the defined pattern, such that an ultra-thin diaphragm with buried strain elements is created. Stated differently, a continuous flow rate of gas is applied to the semi-insulated substrate and the flow rate of the gas is reduced near or on the resistive elements, such that etching will occur around the resistive elements. It should be appreciated that the highly resistive film may be slightly etched, with a thickness of approximately 2 microns or less, during this process.

Figure 6A:
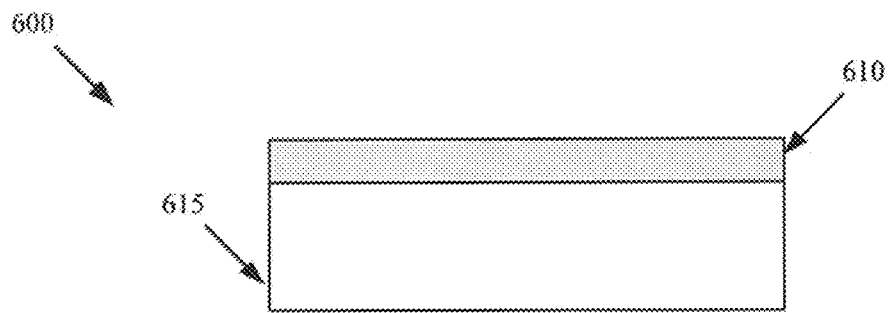
FIGS. 6A-C illustrate various views of an ultra-thin diaphragm pressure sensor, according to an embodiment of the present invention.
Figure 6B:
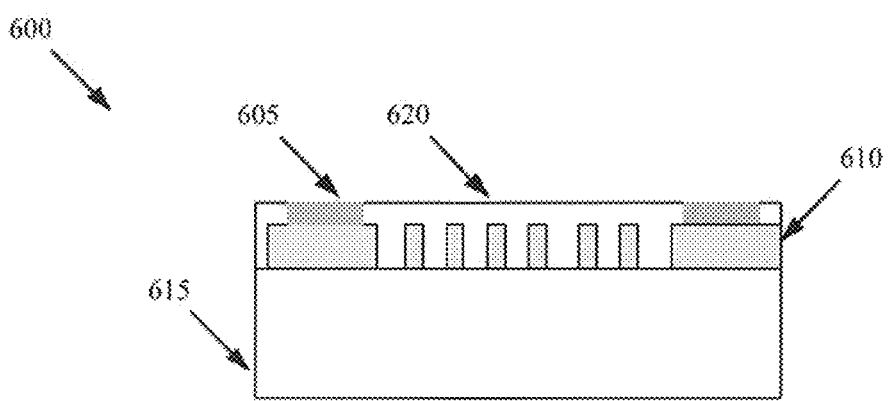
Figure 6C:
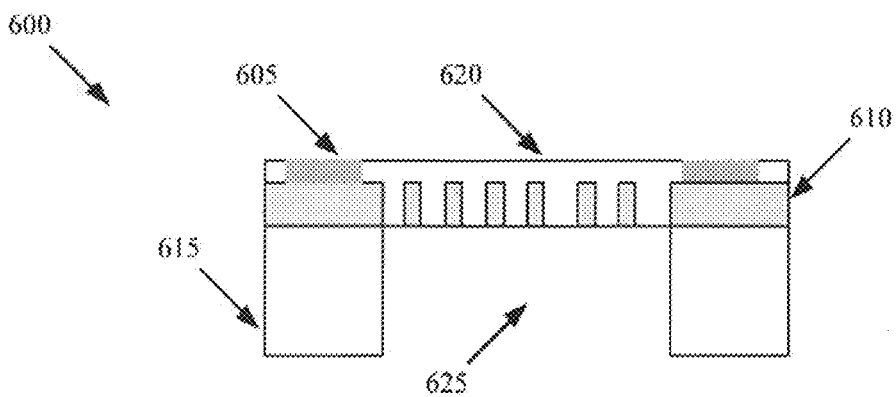

FIGS. 6A-C illustrate various views of an ultra-thin pressure sensor 600, according to an embodiment of the present invention. In FIG. 6A, a heavily doped epilayer 610 is grown on a semi-insulated substrate 615. FIG. 6B shows a resistive strain element etched into a heavily doped epilayer 610. This embodiment may also include a highly resistive SiC film 620 deposited on semi-insulated substrate 615 and the now etched epilayer to create a continuous film. It is followed with etched contact metallization 605. FIG. 6C shows a semi-insulated substrate 615, with a cavity 625, that was selectively etched to create an ultra-thin diaphragm with buried strain elements.

Figure 7:
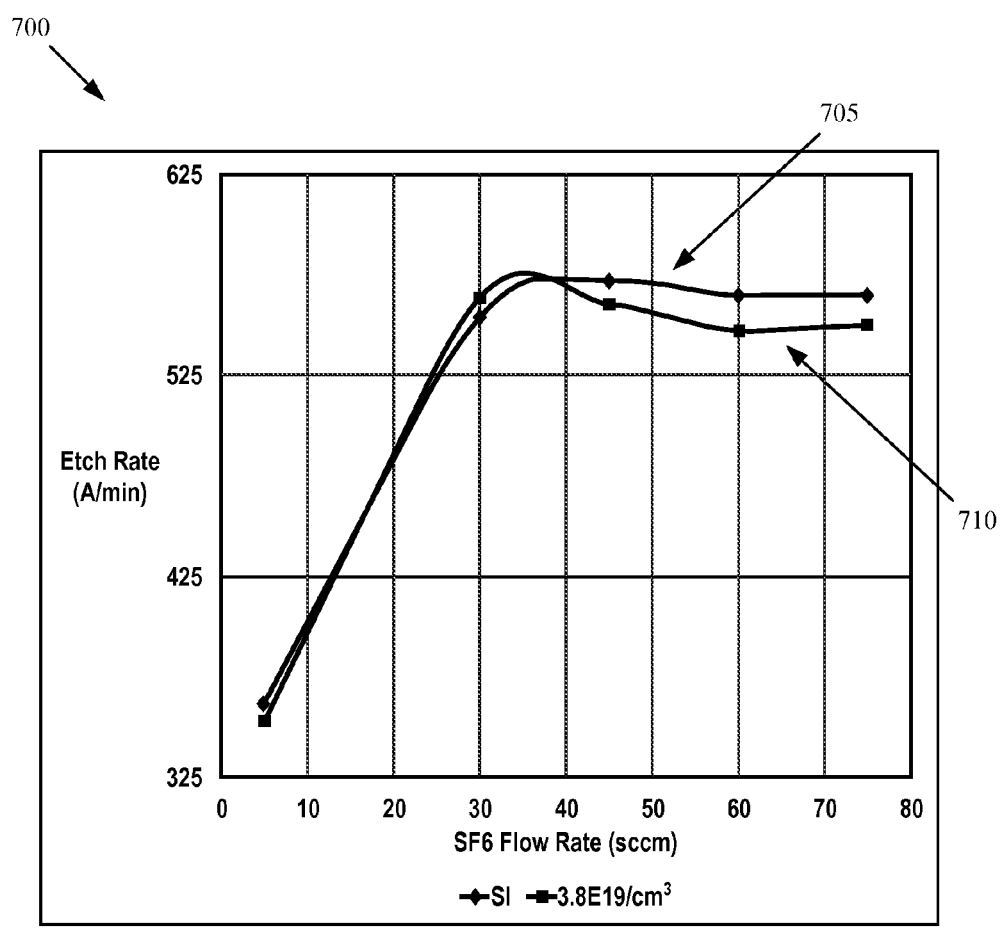
FIG. 7 illustrates a graph of the flow rates of semi-insulated and heavily n-type doped samples etched in sulfur hexafluoride ($SF_6$), according to an embodiment of the present invention.

FIG. 7 illustrates a graph 700 of flow rates of semi-insulated and doped samples etched in $SF_6$, according to an embodiment of the present invention. Graph 700 shows two plots, plot 705 shows the etch rate for the semi-insulated substrate (SI) and plot 710 shows the etch rate for the n-type substrate. The n-type substrate may include an electrical conductivity having a nitrogen doping level of $3.8 \times 10^{19}$ $cm^{-3}$. It should be appreciated that etch selectivity may be greater when nitrogen doping levels are at $3.0 \times 10^{19}$ $cm^3$ or higher.

In this embodiment, the flow rate of $SF_6$ may be measured in standard cubic centimeters per minute (sccm). Graph 700 shows, for example, that at flow rates above 30 sccm, the semi-insulated substrate etched in $SF_6$ had higher etch rates relative to the n-type substrate.

Figure 8:
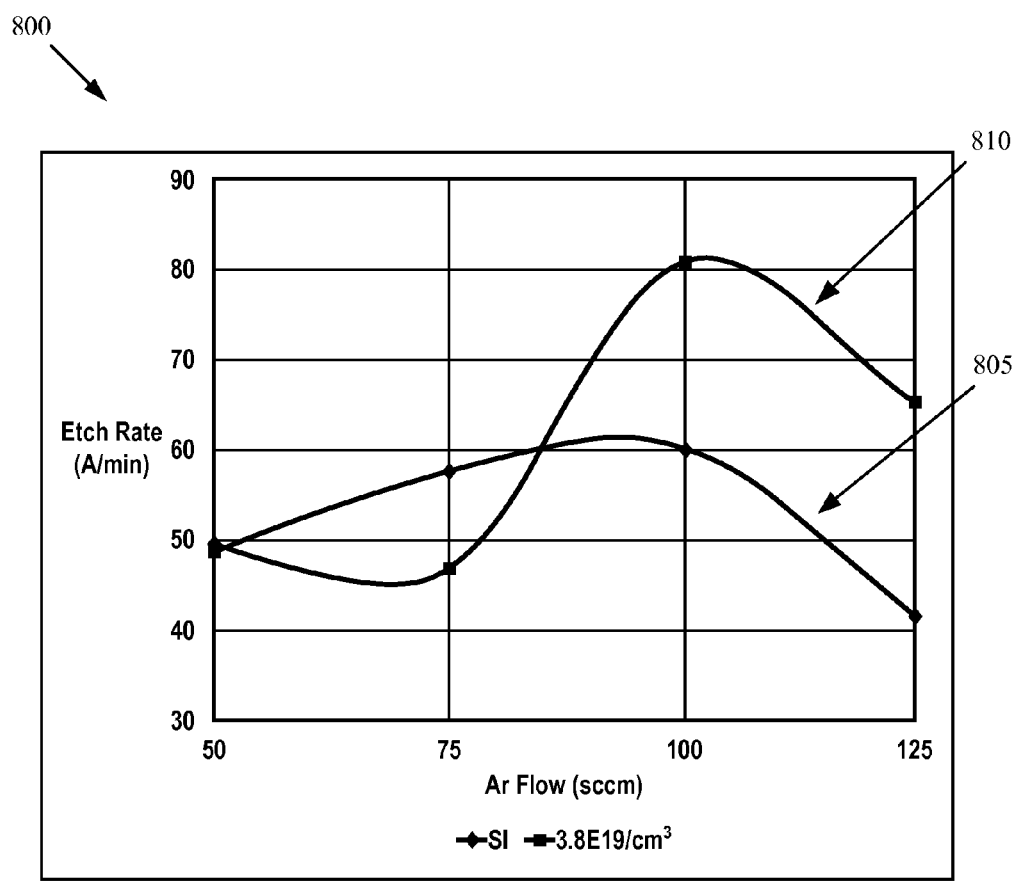
FIG. 8 illustrates a graph of the flow rates of semi-insulated and heavily doped n-type samples etched in Argon (Ar), according to an embodiment of the present invention.

FIG. 8 illustrates a graph 800 of flow rates of semi-insulated and doped samples etched in Ar, according to an embodiment of the present invention. In this embodiment, graph 800 shows two plots, plot 805 shows the etch rate for the semi-insulated substrate and plot 810 shows the etch rate for the n-type substrate. Graph 800 shows, for example, that at flow rates above 75 sccm, the n-type substrate etched in Ar had higher etch rates relative to the semi-insulated substrate.

Figure 9:
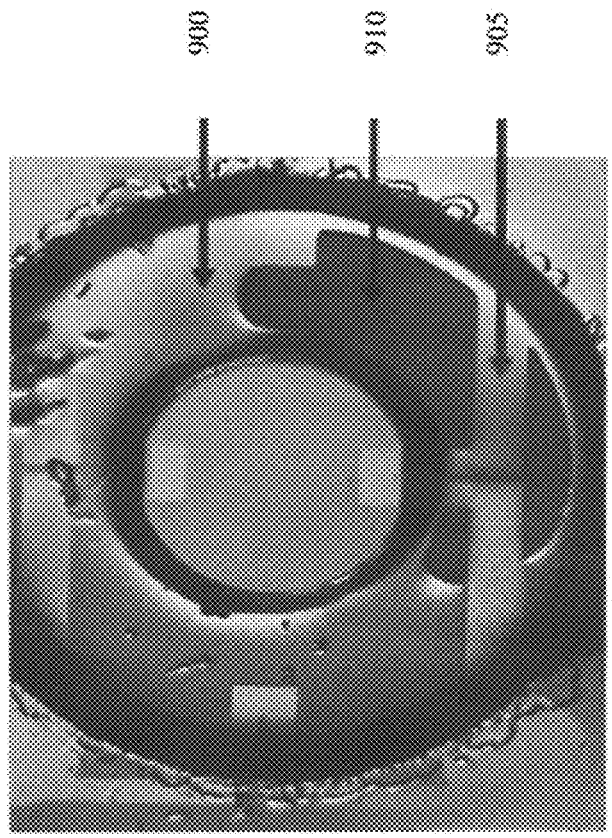
FIG. 9 illustrates an epilayer isolated from a semi-insulated substrate, according to an embodiment of the present invention

FIG. 9 illustrates an epilayer 905 isolated from a semi-insulated substrate 900, according to an embodiment of the present invention. In this embodiment, the back side (the semi-insulated substrate) of substrate 900 is etched, such that a cavity 910 is created. Through the selective etching process, etching slows near epilayer 905, such that epilayer 905 becomes less reactive to, for example, the $SF_6$ gas. This allows portions of epilayer 905 to remain while other portions of semi-insulated substrate 900 are removed, thereby releasing the resistive element.

One or more embodiments pertain to a method of fabricating microstructures in SiC that are less than 2 microns thick. In one embodiment, a heavily doped epilayer is grown on a lower doped or semi-insulated substrate. Resistor heater patterns are defined and etched in the epilayer using an etching chamber. On the substrate side, a cavity may be etched to the resistor pattern. Due to selective etching, the substrate etches completely, leaving a suspended resistor heater. It should be appreciated that various gases, such as $SF_6$ and Ar, and other applicable gases can be used for the etching process.

During the etching process, etch rate of the semi-insulated layer divided by the etch rate of the doped layer may return the etch selectivity between the semi-insulated layer and the doped layer. This may help determine when to reduce or stop the flow rate of the gas on the semi-insulated substrate during the etching process to selectively etch the semi-insulated layer.

It should be appreciated that the ability to fabricate thin (~2 micron) SiC diaphragms with a SiC DSRIE (Dopant Selective Reactive Ion Etching) process will allow direct measurement of sub-psi combustion dynamics in the high temperature section (temperature greater than 600 degrees Celsius) of the combustion chamber of a turbine engine. Dopant selective reactive ion etching of SiC allows highly doped structures to be selectively released from the semi-insulated bulk material. This will allow batch-fabrication to occur in ultra-thin SiC diaphragms. Thin (~1-2 microns), heavily doped membranes are isolated from the bulk of the component, i.e., free-standing SiC micro heater, resistor, inductor, etc.

It will be readily understood that the components of the invention, as generally described and illustrated in the figures herein, may be arranged and designed in a wide variety of different configurations. Thus, the detailed description of the embodiments is not intended to limit the scope of the invention as claimed, but is merely representative of selected embodiments of the invention.

The features, structures, or characteristics of the invention described throughout this specification may be combined in any suitable manner in one or more embodiments. For example, the usage of "certain embodiments," "some embodiments," or other similar language, throughout this specification refers to the fact that a particular feature, structure, or characteristic described in connection with an embodiment may be included in at least one embodiment of the invention. Thus, appearances of the phrases "in certain embodiments," "in some embodiments," "in other embodiments," or other similar language, throughout this specification do not necessarily all refer to the same embodiment or group of embodiments, and the described features, structures, or characteristics may be combined in any suitable manner in one or more embodiments.

One having ordinary skill in the art will readily understand that the invention as discussed above may be practiced with steps in a different order, and/or with hardware elements in configurations that are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A method, comprising:
providing a semi-insulated SiC substrate layer with an N-type SiC layer on one side;
determining an etch selectively based on the etch rate of the semi-insulated SiC substrate divided by the etch rate of the N-type SiC;
determining a flow rate of gas for maximizing the etch selectivity;
determining, based upon the etch selectivity, the etching time; and
dopant selective reactive ion etching the semi-insulated SiC substrate layer based on the determined flow rate for the determined etching time to remove the semi-insulated SiC substrate layer through a vertical etch profile but minimally affecting the N-type SiC layer.

2. The method of claim 1, wherein the dopant selective reactive ion etching of the semi-insulated substrate comprises selectively releasing or lowering the etch rate on a resistive element formed in a heavily doped epilayer.

3. The method of claim 1, further comprising:
growing a heavily doped epilayer on semi-insulated substrate.

4. The method of claim 3, further comprising:
defining a pattern of a resistive element in a heavily doped epilayer.

5. The method of claim 4, further comprising:
etching the heavily doped epilayer to form a resistive element based on the defined pattern.

6. The method of claim 3, wherein the heavily doped substrate comprises a thickness of less than 5 microns.

7. The method of claim 1, further comprising:
defining a pattern on the semi-insulated substrate to selectively etch the semi-insulated substrate.

* * * * *